United States Patent
Achtenberg et al.

(10) Patent No.: US 10,002,086 B1
(45) Date of Patent: Jun. 19, 2018

(54) MULTI-CHANNEL MEMORY OPERATIONS BASED ON BIT ERROR RATES

(71) Applicant: SANDISK TECHNOLOGIES LLC, Plano, TX (US)

(72) Inventors: Stella Achtenberg, Netanya (IL); Eran Sharon, Rishon Lezion (IL); Ran Zamir, Ramat Gan (IL); Amir Shaharabany, Kochav Yair (IL)

(73) Assignee: SanDisk Technologies LLC, Plano, TX (US)

( * ) Notice: Subject to any disclaimer, the term of this patent is extended or adjusted under 35 U.S.C. 154(b) by 0 days. days.

(21) Appl. No.: 15/385,324

(22) Filed: Dec. 20, 2016

(51) Int. Cl.
| | | |
|---|---|---|
| *H03M 13/00* | (2006.01) | |
| *G06F 13/16* | (2006.01) | |
| *G06F 13/40* | (2006.01) | |
| *G06F 11/10* | (2006.01) | |
| *G11C 29/52* | (2006.01) | |
| *H03M 13/11* | (2006.01) | |
| *G06F 3/06* | (2006.01) | |

(52) U.S. Cl.
CPC ........ *G06F 13/1689* (2013.01); *G06F 3/0604* (2013.01); *G06F 3/064* (2013.01); *G06F 3/0619* (2013.01); *G06F 3/0629* (2013.01); *G06F 3/0658* (2013.01); *G06F 3/0679* (2013.01); *G06F 11/1068* (2013.01); *G06F 13/1673* (2013.01); *G06F 13/4068* (2013.01); *G11C 29/52* (2013.01); *H03M 13/1105* (2013.01); *H03M 13/6337* (2013.01)

(58) Field of Classification Search
CPC ... G06F 13/1689; G06F 3/0604; G06F 3/0619
See application file for complete search history.

(56) References Cited

U.S. PATENT DOCUMENTS

| | | | | |
|---|---|---|---|---|
| 6,738,947 B1 * | 5/2004 | Maeda | ............. | H03M 13/1515 714/785 |
| 6,907,559 B2 * | 6/2005 | Hall | .................... | G11B 20/1833 714/755 |
| 7,283,498 B2 * | 10/2007 | Ro | ........................ | H04L 5/0007 370/208 |
| 7,505,766 B2 * | 3/2009 | Qi | .......................... | G03B 27/42 343/703 |
| 8,187,936 B2 * | 5/2012 | Alsmeier | .......... | H01L 27/11551 257/324 |
| 8,355,279 B2 * | 1/2013 | Yoon | .................... | G06F 11/1072 365/185.03 |
| 9,015,537 B2 * | 4/2015 | Griffin | .................. | G06F 11/008 714/704 |
| 9,118,240 B2 * | 8/2015 | Lanni | ...................... | H02M 1/10 |
| 2009/0164704 A1 | 6/2009 | Kanade et al. | | |

(Continued)

*Primary Examiner* — Esaw T Abraham
(74) *Attorney, Agent, or Firm* — Toler Law Group, PC (57) ABSTRACT

In an illustrative example, a device includes a memory and a controller that is coupled to the memory and that is configured to communicate with the memory using at least a first channel and a second channel. The controller includes a bit error rate (BER) estimator configured to estimate a first BER corresponding to the first channel and a second BER corresponding to the second channel. The controller also includes a throughput balancer configured to determine whether to adjust at least one of a first clock rate of the first channel or a second clock rate of the second channel based on the first BER and the second BER.

20 Claims, 7 Drawing Sheets

(56) References Cited

U.S. PATENT DOCUMENTS

| | | | |
|---|---|---|---|
| 2010/0064111 A1* | 3/2010 | Kunimatsu | G06F 12/08 711/161 |
| 2011/0238899 A1* | 9/2011 | Yano | G06F 12/0246 711/103 |
| 2013/0086309 A1 | 4/2013 | Lee et al. | |
| 2014/0115410 A1 | 4/2014 | Kealy et al. | |

* cited by examiner

MULTI-CHANNEL MEMORY OPERATIONS BASED ON BIT ERROR RATES

FIELD OF THE DISCLOSURE

The present disclosure is generally related to electronic devices and more particularly to operations at devices including multi-channel memories.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase storage density of a memory device, a bit error rate (BER) of data stored at the memory device may also increase. Flash memory devices can also enhance data storage capacity by including more than one memory die. When multiple dies are included, the BER of the dies may vary. In such scenarios, the overall throughput of the flash memory device may be roughly equal to the throughput of the "slowest" memory die, i.e., the memory die having the highest BER

DETAILED DESCRIPTION

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. As an illustrative example, throughput balancing techniques may be utilized to improve wired or wireless communications. Those of skill in the art will recognize that techniques described herein are applicable to other implementations.

Figure 1:
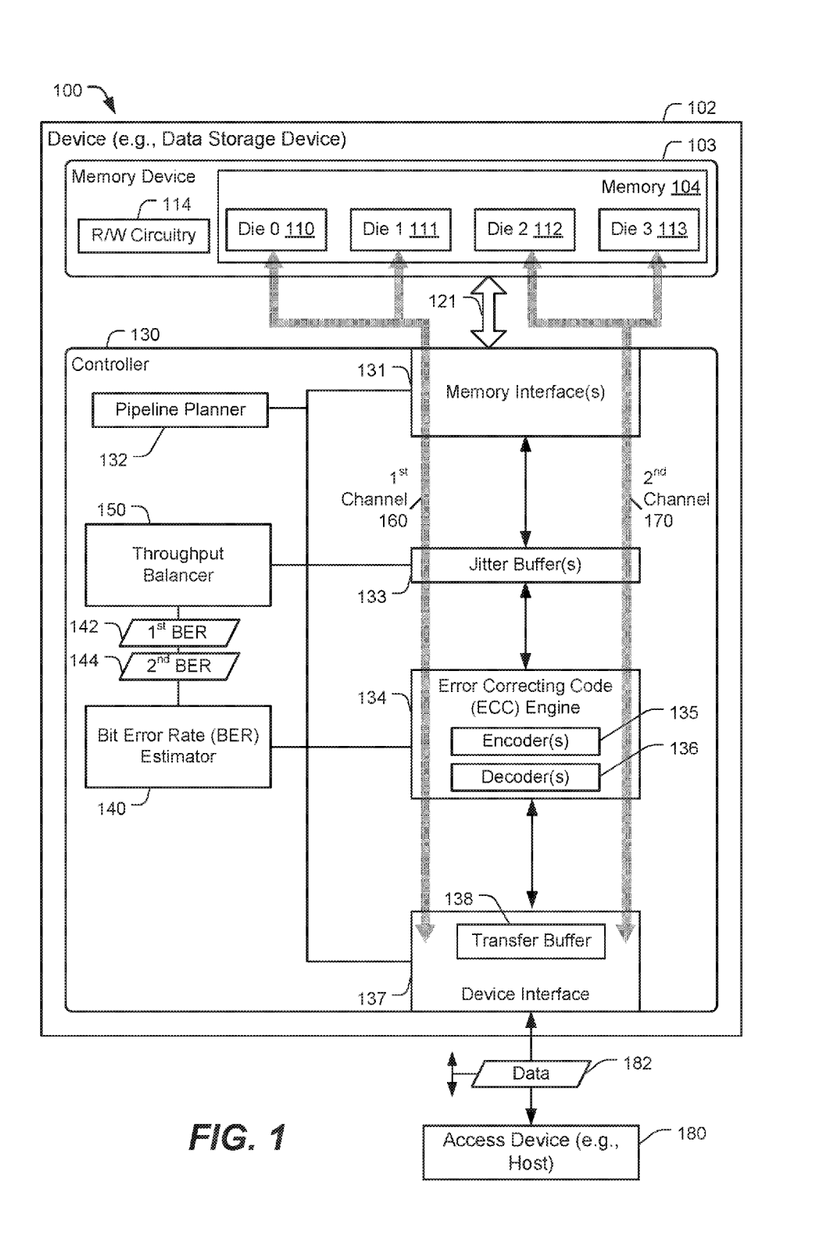
FIG. 1 is a diagram of a particular illustrative example of a system that is operable to selectively balance throughput at a multi-channel memory based on bit error rates.

Referring to FIG. 1, a particular illustrative example of a system is depicted and generally designated 100. The system 100 includes a device 102 (e.g., a data storage device) and an access device 180 (e.g., a host device). The device 102 includes a memory device 103 coupled to a controller 130.

In particular aspects, the memory device 103 is a multi-channel memory. To illustrate, in the example of FIG. 1, the memory device 103 includes a plurality of memory dies, including memory dies 110, 111, 112, and 113. A first channel 160 supports data access operations for a first subset of the memory dies (e.g., the memory dies 110-111). A second channel 170 supports data access operations for a second subset of the memory dies (e.g., the memory dies 112-113). Although FIG. 1 illustrates two subsets of memory dies with each subset having the same number of memory dies, in alternative examples a different number of subsets may be present and different subsets may include different numbers of memory dies. As used herein, a "channel" may correspond to a logical and/or physical data path between the memory device 103 and the access device 180. In some examples, each channel 160, 170 may include distinct components (e.g., hardware elements) that are dedicated for the respective channel. Alternatively, or in addition, each channel 160, 170 may share certain components. Although a configuration with two channels and two memory dies per channel is shown in FIG. 1, it is to be understood that in alternative examples, the techniques of the present disclosure may be utilized with respect to devices that have more than two channels and/or a different number of memory dies per channel.

The device 102 and the access device 180 may be operationally coupled via a connection (e.g., a communication path), such as a bus or a wireless connection. The device 102 may include a device interface 137 that enables communication via the communication path between the device 102 and the access device 180, such as when the device interface 137 is communicatively coupled to the access device 180.

In some implementations, the device 102 may be embedded within the access device 180, such as in accordance with a Joint Electron Devices Engineering Council (JEDEC) Solid State Technology Association Universal Flash Storage (UFS) configuration. For example, the device 102 may be configured to be coupled to the access device 180 as embedded memory, such as eMMC® (trademark of JEDEC Solid State Technology Association, Arlington, Va.) and eSD, as illustrative examples. To illustrate, the device 102 may correspond to an eMMC (embedded MultiMedia Card) device. As another example, the device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington. Va.), or a CompactFlash® (CF) card (trademark of SanDisk Corporation, Milpitas, Calif.). Alternatively, the device 102 may be removable from the access device 180 (i.e., "removably" coupled to the access device 180). As an example, the device 102 may be removably coupled to the access device 180 in accordance with a removable universal serial bus (USB) configuration.

In some implementations, the device 102 may include or correspond to a solid state drive (SSD) which may be included in, or distinct from (and accessible to), the access device 180. For example, the device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the device 102 is coupled to the access device 180 indirectly, e.g., via a network. For example, the network may include a data center storage system network, an enterprise storage system network, a storage area network, a cloud storage network, a local area network (LAN), a wide area network (WAN), the Internet. and/or another network. In some implementations, the device 102 may be a network-attached storage (NAS) device or a component (e.g., a solid-state drive (SSD) device) of a data center storage system, an enterprise storage system, or a storage area network.

The device 102 may operate in compliance with a JEDEC industry specification. For example, the device 102 may operate in compliance with a JEDEC eMMC specification, a JEDEC Universal Flash Storage (UFS) specification, one or more other specifications, or a combination thereof. In some implementations, the device 102 and the access device 180 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples.

The access device 180 may include a memory interface (not shown) and may be configured to communicate with the device 102 via the memory interface to read data from and write data to the memory device 103 of the device 102. For example, the access device 180 may operate in compliance with a Joint Electron Devices Engineering Council (JEDEC) industry specification, such as a Universal Flash Storage (UFS) Access Controller Interface specification. As other examples, the access device 180 may operate in compliance with one or more other specifications, such as a Secure Digital (SD) Access Controller specification, as an illustrative, non-limiting example. The access device 180 may communicate with the memory device 103 in accordance with any other suitable communication protocol.

The access device 180 may include a processor and a memory. The memory may be configured to store data and/or instructions that may be executable by the processor. The memory may be a single memory or may include multiple memories, such as one or more non-volatile memories, one or more volatile memories, or a combination thereof. The access device 180 may issue one or more commands to the device 102, such as one or more requests to erase data, read data from, or write data to the memory device 103 of the device 102. For example, the access device 180 may be configured to provide data, such as user data 182, to be stored at the memory device 103 or to request data to be read from the memory device 103. The access device 180 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The device 102 includes the controller 130 and the memory device 103 that is coupled to the controller 130. The memory device 103 may include a memory 104 having one or more memory dies (e.g., the four memory dies 110-113 shown in FIG. 1). Each of the memory dies 110-113 may correspond to a non-volatile memory of storage elements. For example, the memory 104 may include flash memory, such as a NAND flash memory, or a resistive memory, such as a resistive random access memory (ReRAM), as illustrative, non-limiting examples. The memory 104 may have a three-dimensional (3D) memory configuration. As an example, the memory 104 may have a 3D vertical bit line (VBL) configuration. In a particular implementation, the memory 104 includes non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include one or more blocks, such as a NAND flash erase group of storage elements. To illustrate, the memory 104 may include a group of storage elements that may be configured as a physical page, a word line, or a block, as illustrative, non-limiting examples. Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 114, to support operation at the memory dies 110-113. Although depicted as a single component, the read/write circuitry 114 may be divided into separate components of the memory device 103, such as read circuitry and write circuitry. The read/write circuitry 114 may be external to the memory 104. Alternatively, one or more of the individual memory dies 110-113 may include corresponding read/write circuitry that is operable to read data from and/or write data to storage elements within the individual memory die independent of any other read and/or write operations at any of the other memory dies. In some examples, when data is stored in the memory device 103, the data may be "striped" across one or more of the memory dies 110-113. Similarly, reading such data may, in some example, include accessing multiple ones of the memory dies 110-113.

The controller 130 is coupled to the memory device 103 via a bus 121 and one or more memory interfaces 131. For example, the bus 121 may support the channels 160, 170 to enable the controller 130 to communicate with the memory 104. To illustrate, the memory interfaces 131 may include a first memory interface and a second memory interface. The first memory interface may enable the controller 130 to send and receive data from the memory dies 110, 111 via bus 121 using the first channel 160. The second memory interface may enable the controller 130 to send and receive data from the memory dies 112, 113 via the bus 121 using the second channel 170. In an illustrative example, each of the memory interfaces 131 is a flash interface module (FIM).

In some aspects, the controller 130 includes a pipeline planner 132 that is configured to interact with one or more other components or modules of the controller 130 and that is configured to determine decoding times and/or other system parameters. For example, the pipeline planner 132 may be configured to schedule and arbitrate access by the memory interfaces 131 to the individual memory dies 110-113. To illustrate, the pipeline planner 132 may schedule sense operations and transfer operations (e.g., by scheduling sense commands and transfer commands) at the individual memory dies 110, 111 corresponding to the first channel 160. Similarly, the pipeline planner 132 may schedule sense operations and transfer operations at the individual memory dies 112, 113 corresponding to the second channel 170. During a sense operation, bits stored at individual storage elements of a memory die may be sensed. During a transfer operation, the sensed bits may be transferred via the bus 121 to the corresponding one of the memory interfaces 131. In some examples, if a particular die coupled to a memory interface 131 is busy, the pipeline planner 132 may schedule sense and transfer commands at another die coupled to that memory interface 131, so that the memory interface 131 is utilized instead of remaining idle.

The controller may also include one or more jitter buffers 133. To illustrate, a first of the jitter buffers 133 may be reserved for the first channel 160 and a second of the jitter buffers 133 may be reserved for the second channel 170. In a particular aspect, the jitter buffers 133 correspond to system memory resources that can be dynamically allocated and deallocated by the controller 130 during operation, for example in response to execution of firmware instructions. Thus, the jitter buffers 133 may be shared, e.g., dynamically distributed between the channels 160, 170. As further described herein, the jitter buffers 133 may be viewed as a single memory buffer having different portions being assigned to different channels based on operating conditions to increase or maximize overall throughput. During read operations, data that is received by one of the memory interfaces 131 may be stored in a corresponding one of the jitter buffers 133. During write operations, one of the memory interfaces 131 may retrieve data from a corresponding one of the jitter buffers 133 for communication to the memory device 103 via the bus 121.

The controller 130 may further include an error correction code (ECC) engine 134 that is configured, during a write operation, to receive data (e.g., the user data 182) and to generate one or more ECC codewords (e.g., including a data portion and a parity portion) based on the data. To illustrate, the ECC engine 134 may include one or more encoders 135 (e.g., one encoder per channel 160, 170) configured to encode data using an ECC encoding technique. The encoders 135 may correspond to Reed-Solomon encoders, Bose-Chaudhuri-Hocquenghem (BCH) encoders, low-density parity check (LDPC) encoders, turbo encoders, encoders configured to encode the data according to one or more other ECC techniques, or a combination thereof, as illustrative, non-limiting examples.

The ECC engine 134 may further be configured, during a read operation, to receive data (e.g., codewords) from the jitter buffers 133 to perform error detection/correction operations on the data, prior to the (error-corrected) data being provided to the access device 180. For example, the ECC engine 134 may include one or more decoders 136 (e.g., one decoder per channel 160, 170). The decoders 136 may correspond to Reed-Solomon decoders. BCH decoders, LDPC decoders, turbo decoders, decoders configured to decode the codewords according to one or more other ECC techniques, or a combination thereof, as illustrative, non-limiting examples.

The device interface 137 may support communication between the controller 130 and the access device 180. In particular aspects, the device interface 137 includes at least one transfer buffer 138, which may alternatively be referred to as a transfer RAM (TRAM) or a staging buffer. To illustrate, a first portion of the transfer buffer 138 may be reserved for data being communicated via the first channel 160 and a second portion of the transfer buffer 138 may be reserved for data being communicated via the second channel 170.

During a write operation, the controller 130 may receive data and instructions from the access device 180. The controller 130 may also send data and a write command to cause the memory device 103 to store data to a specified address. The write command may specify a physical address of a portion of the memory 104 (e.g., a physical address of a word line) that is to store the data. The controller 130 may also be configured to send data and commands to the memory device 103 associated with background scanning operations, garbage collection operations, and/or wear leveling operations, etc., as illustrative, non-limiting examples.

During a read operation, the controller 130 may send data to the access device 180. To illustrate, the controller 130 may be configured to send a read command to the memory device 103 to access data from a specified address at the memory 104. The read command may specify the physical address of a portion of the memory 104 (e.g., a physical address of a word line). The controller 130 may cause the memory device 103 to access a representation of a codeword, such as in response to a request for read access from the access device 180. The controller 130 may send a read command to cause the representation of the codeword to be sensed and transferred from the memory device 103 to the ECC engine 134 via one of the memory interfaces 131 and jitter buffers 133. The ECC engine 134 may determine that the received representation of the codeword includes one or more bit errors, and may correct the bit errors to generate error-corrected data that is stored in the transfer buffer 138 for subsequent communication to the access device 180. In a multi-channel implementation, such as shown in FIG. 1, the decoders 136 for individual channels may operate in parallel and generate error-corrected data for buffering in the transfer buffer 138.

Generally, the decoding time of a codeword may increase as the number of bit errors in the codeword increases. Due to factors such as memory die quality, die-to-die variation, beginning of life, end of life, data retention, and read/write temperature difference, different ones of the memory dies 110-113 may have different BERs. Consequently, codewords read from one of the memory dies 110-113 may have a higher or lower average BER than codewords read from another of the memory dies 110-113. In sequential read operations in which the access device 180 receives data via the channels 160, 170 in alternating fashion, the variation in BER may adversely impact performance. To illustrate, if the memory dies 110-111 have higher BERs than the memory dies 112-113, then data throughput via the first channel 160 may be less than data throughput via the second channel 170, due to the decoder 136 of the first channel 160 taking longer to perform error correction operations. In this scenario, the overall throughput of the device 102 may be governed by the lowest individual channel throughput, i.e., the throughput of the first channel 160.

One possible method of avoiding "worst-channel" performance is to introduce a hardware arbiter that distributes workload amongst the available decoders 136 based on decoder availability. However, such as hardware arbiter may be complex to design and may significantly increase a cost of the device 102.

The techniques of the present disclosure may enable avoiding the "worst-channel" performance without adding complex hardware to the device. In accordance with the described techniques, the controller 130 may include a BER estimator 140 and a throughput balancer 150, which may correspond to hardware components of the controller 130, software or firmware executed at the controller 130, or a combination thereof.

The BER estimator 140 may estimate a first BER 142 corresponding to the first channel 160 and a second BER 144 corresponding to the second channel 170. For example, the BER estimator 144) may determine estimated BERs for each of the memory dies 110-113, and the BER corresponding to a channel may be a highest or average of the BERs for each of the memory dies of the channel. The BER estimator 140 may estimate BERs on a page level, a die level, a word line level, a codeword level, or some other level. Moreover, the BER estimator 140 may estimate BERs statically (e.g., at beginning of life), periodically, in response to occurrence of a particular event (e.g., a power-up event), or at some other frequency.

In a first example, the BER estimator 140 may estimate BERs based on syndrome weights (SWs) determined during decoding operations at the decoders 136 of the channels 160, 170. To illustrate, during LDPC decoding, one of the decoders 136 may determine a syndrome weight based on performing bit-level computations, where a higher syndrome weight corresponds to a greater number of potential bit errors. Thus, when data read from a first memory die has a higher syndrome weight than data read from a second memory die, the first memory die may be estimated as having a higher BER than the second memory die. In some examples, the BER estimator 140 may store or have access to a mapping of syndrome weights to estimated BERs.

In a second example, the BER estimator may 140 estimate BERs based on a decoding mode of the decoding operations at the decoders 136 of the channels 160, 170. To illustrate. LDPC decoders may be configured to operate in multiple modes or gears, such as a first gear, a second gear, and a third gear. Decoding operations in a lower gear may be less complex and faster than decoding operations in a faster gear. Thus, the higher the decoding mode or gear, the longer the decoding time. In a particular example, a decoder may have multiple decoding gear shifts that may differ in the decoding algorithm used (e.g., bit flipping or message passing decoding algorithms like min-sum variants and belief propagation) and in a message resolution of a fixed point implementation (e.g., 1, 2, 3 , . . . bit messages). Upon receiving a codeword (or block) for decoding, an LDPC decoder may first try decoding in gear 1. If gear 1 fails, the LDPC decoder may try decoding in gear 2. If gear 2 also fails, the LDPC decoder may try decoding in gear 3. Thus, the BER estimator 140 may be able to determine which of the BERs 142, 144 is higher by monitoring which LDPC decoding mode the decoders 136 of the channels 160, 170 are operating in. In some examples, the BER estimator 140 may store or have access to a mapping of decoding modes to estimated BERs.

The throughput balancer 150 may be configured to determine whether to adjust various operating parameters at the device 102 based on a comparison of the first BER 142 and the second BER 144. For example, if the first BER 142 is equal to or nearly equal to (e.g., differing by less than a threshold amount from) the second BER 144, the throughput balancer 150 may refrain from adjusting any operating parameters. However, if the first BER 142 and the second BER 144 differ by more than the threshold amount, the throughput balancer 150 may selectively perform various operations to achieve a higher throughput than the "worst performance" case described above.

As a first example, each of the channels 160, 170 may operate according to an independent clock signal and the throughput balancer 150 may adjust the clock rates of the channels 160, 170 based on the BERs 142, 144. As used herein, the clock rate of a channel may be the clock rate of a clock signal that is applied to one or more components of the channel. In accordance with the present disclosure, when the BERs 142, 144 differ by at least a threshold amount, the clock rates of the clock signals provided to component(s) of the channels 160, 170 may be adjusted so that the LDPC decoders 136 of the channels 160, 170 have similar utilization. This may be achieved by increasing the clock rate of the clock signal of the higher BER channel to speed up overall operation at the channel, which is being slowed by complex LDPC operations due to high BER. Alternatively, or in addition, this may be achieved by decreasing the clock rate of the clock signal of the lower BER channel to slow down overall operation at the channel to match that of the higher BER channel. In a particular aspect, the throughput balancer 150 programmatically adjusts the clock rates based on modifying parameters of a phase-locked loop (PLL) or other circuitry. Adjustment of clock rates is further described with reference to FIG. 3.

As a second example, the throughput balancer 150 may dynamically adjust system resource allocations based on the BERs 142, 144. To illustrate, because LDPC operations take longer when BER is high, the size of the jitter buffer 133 in a higher BER channel may be increased relative to the size of the jitter buffer 133 in a lower BER channel. Increasing the size of the jitter buffer 133 when BER is high may mitigate a buffering bottleneck between the memory interface 131 and the decoder 136 of the higher BER channel, and may enable the memory interface 131 of the higher BER channel to continue operating with reduced "hiccups." In some examples, allocation of the transfer buffer 138 may be adjusted in addition to or instead of the size of the jitter buffers 133. To illustrate, when the channels 160, 170 have equal or near-equal BERs 142, 144, half of the transfer buffer 138 may be reserved for the first channel 160 and the other half of the transfer buffer 170 may be reserved for the second channel. When the BERs 142, 144 are not equal or near-equal, the transfer buffer allocation for the lower BER channel may be increased. Adjustment of system resource allocations is further described with reference to FIGS. 4 and 5.

As a third example, the throughput balancer 150 may notify the pipeline planner 132 to adjust when sense/transfer commands are executed at one or more of the memory interfaces 131 based on the BERs 142, 144. To illustrate, when a memory die has a higher BER and decoding operations are taking longer, sense/transfer execution times may be adjusted so that the memory interface coupled to that memory die retrieves data less frequently rather than dealing with "hiccups." Adjustment of sense/transfer execution time is further described with reference to FIG. 6.

It is to be understood that the above examples of operating parameters the throughput balancer 150 may selectively adjust are provided for illustration, and are not to be considered limiting. In alternative implementations, the throughput balancer 150 may be configured to selectively adjust more, fewer, and/or different operating parameters.

Moreover, in some cases, the throughput balancer 150 may maximally adjust one operating parameter before adjusting another operating parameter. As an illustrative non-limiting example, when the BERs 142, 144 differ by more than a threshold amount, the throughput balancer 150 may estimate decoding times D1, D2 at the channels 160, 170, respectively, where the higher BER channel will have a longer estimated decoding time. The throughput balancer 150 may determine equalization factors s1, s2 based on the estimated decoding times D1, D2. The equalization factors s1, s2 may correspond to clock rate adjustments, and may be constrained by average and peak power constraints at the device 102. The throughput balancer 150 may determine new estimated decoding times based on the equalization factors, i.e. D1new=s1*D1 and D2new=s2*D2. If the new estimated decoding times are equal or near-equal (e.g., differ by less than a threshold amount), this means that clock rate adjustment is sufficient to balance throughput at the channels 160, 170. However, if the new estimated decoding times are not equal or near-equal and further adjustment of clock rates is unavailable (e.g., due to averagepeak power constraints), the throughput balancer 150 may proceed to adjust buffer allocations, sense/transfer execution times, or both.

The device 102 of FIG. 1 may thus be operable to balance throughput (e.g., to reduce throughput imbalance) at a multi-channel memory based on BERs. For example, if channel BERs are different, such as due to differences in BERs of individual memory dies, the device 102 may selectively adjust operating parameters (e.g., clock rate, buffer allocation, sense/transfer execution time, etc.) so that the overall throughput of the device 102 is approximately an average of the individual channel throughputs rather than being constrained by the lowest channel throughput.

Figure 2:
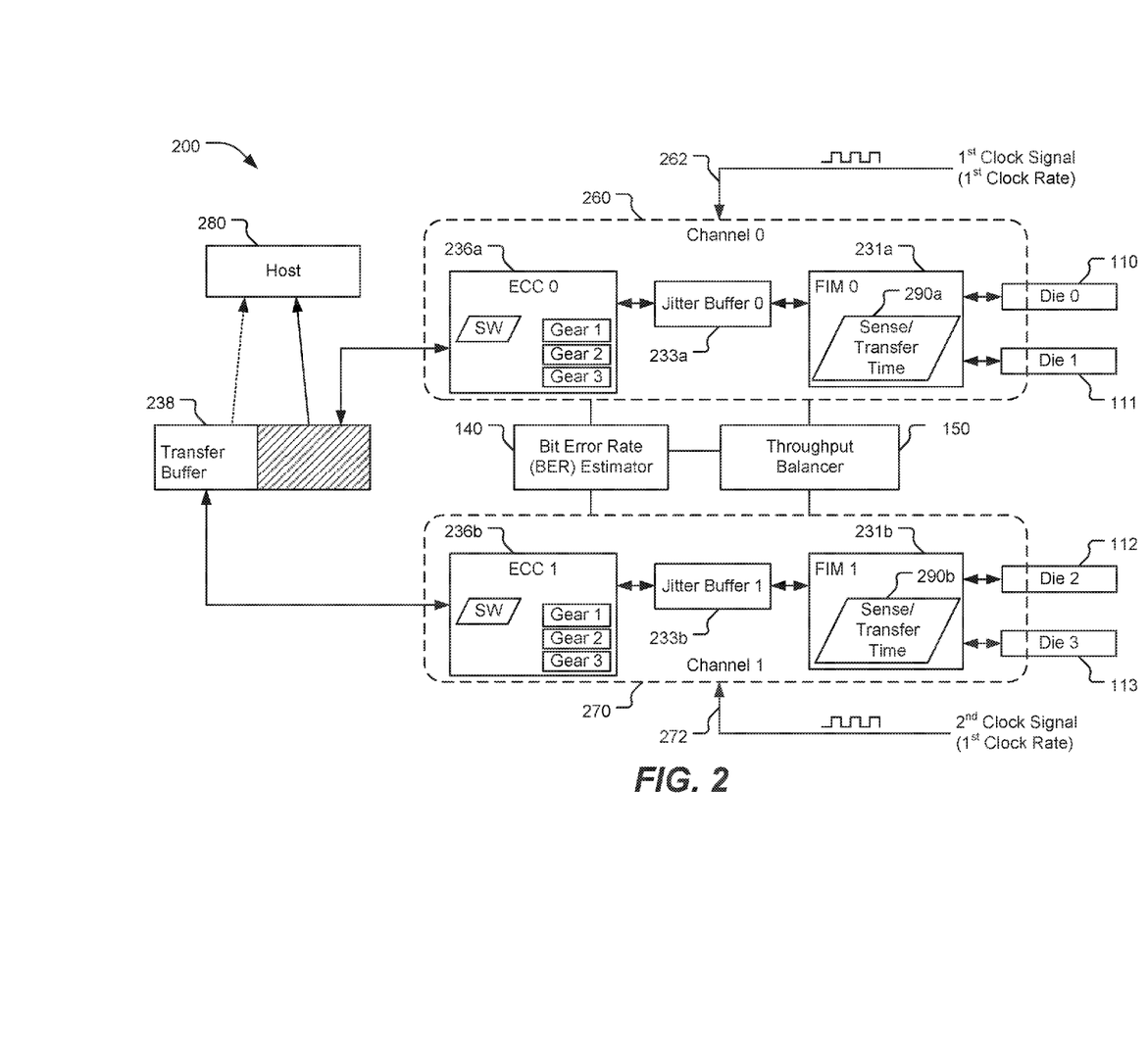
FIG. 2 is a diagram illustrating particular aspects of an example of the system of FIG. 1.

FIGS. 2-7 illustrate various examples of balancing throughput at a multi-channel memory based on BERs. In particular, FIG. 2 illustrates a system 200 that includes the four memory dies 110-113 of FIG. 1. The memory dies 110, 111 are accessible to a host 280 via a first channel 260 (denoted "Channel 0"). The memory dies 112, 113 are accessible to the host 280 via a second channel 270 (denoted "Channel 1"). In an illustrative aspect, the host 280 corresponds to the access device 180 of FIG. 1 and the channels 260, 270 correspond to the channels 160, 170 of FIG. 1.

The first channel 260 may include a first FIM 231a ("denoted FIM 0"), a first jitter buffer 233a (denoted "Jitter Buffer 0"), and a first ECC decoder 236a (denoted "ECC 0"). The first FIM 231a may be configured to retrieve data from the memory dies 110, 111 in accordance with a first sense/transfer execution time 290a. The second channel 270 may include a second FIM 231b ("denoted FIM 1"), a second jitter buffer 233b (denoted "Jitter Buffer 1"), and a second ECC decoder 236b (denoted "ECC 1"). The second FIM 231b may be configured to retrieve data from the memory dies 112, 113 in accordance with a second sense/transfer execution time 290b. In an illustrative aspect, the FIMs 231 correspond to the memory interfaces 131, the jitter buffers 233 correspond to the jitter buffers 133, and the ECC decoders 236 correspond to the decoders 136 of FIG. 1.

The ECC decoders 236a. 236b may be configured to write data to respective portions of a transfer buffer 238, where the portions of the transfer buffer 238 are accessible by the host 280, as shown. In an illustrative aspect, the transfer buffer 238 corresponds to the transfer buffer 138 of FIG. 1.

In the example illustrated by FIG. 2, the channels 260, 270 may have equal or near-equal BERs. For example, the BER estimator 140 may determine that a first BER of the first channel 260 differs by less than a threshold amount from a second BER of the second channel 270. In a particular aspect, the BER estimator 140 may estimate the BERs of the channels 260, 270 based on syndrome weights computed by the ECC decoders 236, based on the mode (e.g., gear) that the ECC decoders 236 are operating in, based on one or more other metrics (e.g., data retention metrics, time since beginning of life, time to end of life, read/write temperature difference, etc.), or any combination thereof. In response, the throughput balancer 150 may refrain from adjusting operating parameters of the channels 260, 270. To illustrate, when the BERs differ by less than a threshold amount, a first clock rate of a first clock signal 262 applied to components of the first channel 260 and a second clock rate of a second clock signal 272 applied to components of the second channel 270 may be the same clock rate. Further, the sizes of the jitter buffers 233a, 233b may be approximately equal and the sense/transfer execution times 290a, 290b may indicate approximately the same frequency of performing sense/transfers at different memory dies. The sizes of the portions of the transfer buffer 238 allocated for the first channel 260 (e.g., the portion having a hatch pattern in FIG. 2) and for the second channel 270 may depend on a speed of the host 280.

Figure 3:
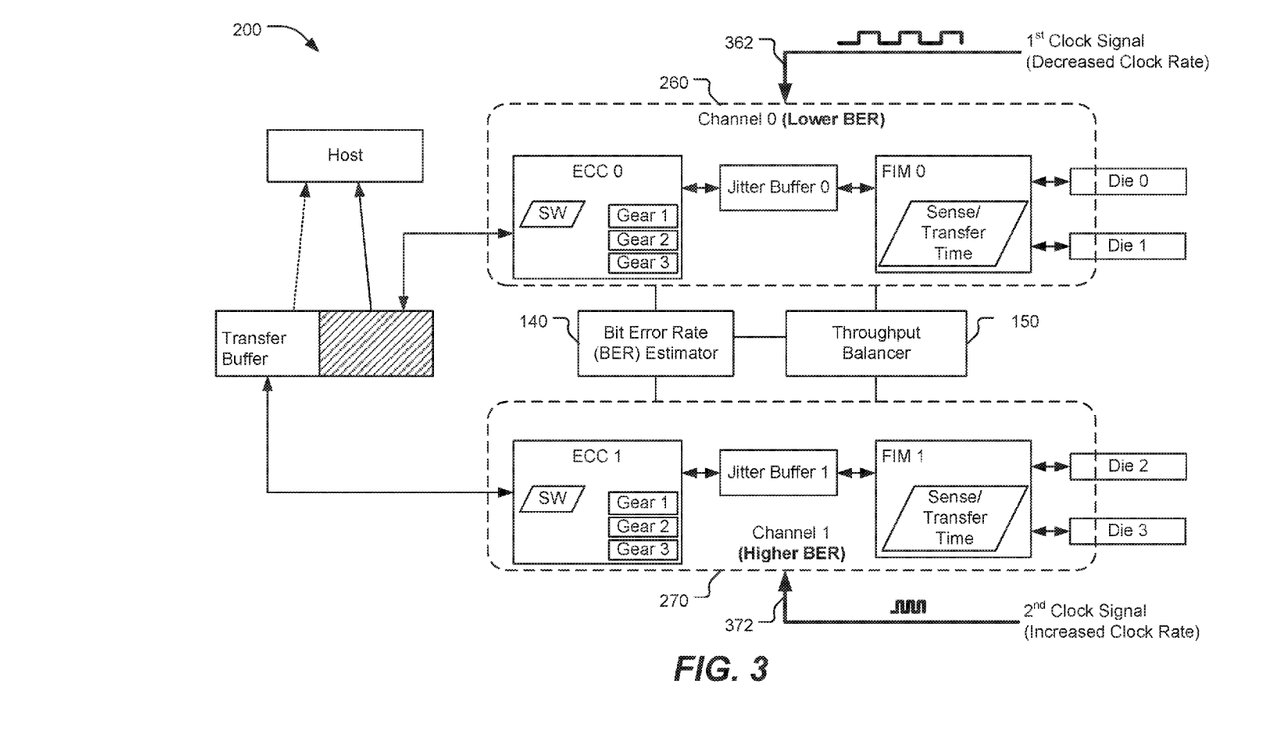
FIG. 3 is a diagram illustrating particular aspects of another example of the system of FIG. 1, including adjusting a clock rate of a multi-channel memory based on bit error rates.

Continuing to FIG. 3, during operation at the system 200, the throughput balancer 150 may determine that the second channel 270 has a higher estimated BER than the first channel 260. As described with reference to FIG. 1, the throughput balancer 150 may, in response to such a determination, perform various operations in an attempt to balance the throughput of the channels 260, 270. In FIG. 3, the throughput balancer 150 slows down the clock rate of the first clock signal 262 applied to the lower BER channel 260, as shown at 362. For example, the first clock signal 262 may have a third clock rate that is lower than the first clock rate of FIG. 2. The throughput balancer 150 also speeds up the clock rate of the second clock signal 272 applied to the higher BER channel 270, as shown at 372. For example, the second clock signal 272 may have a fourth clock rate that is higher than the first clock rate of FIG. 2. In some examples, the throughput balancer 150 may adjust only one of the clock signals rather than adjusting both clock signals.

Figure 4:
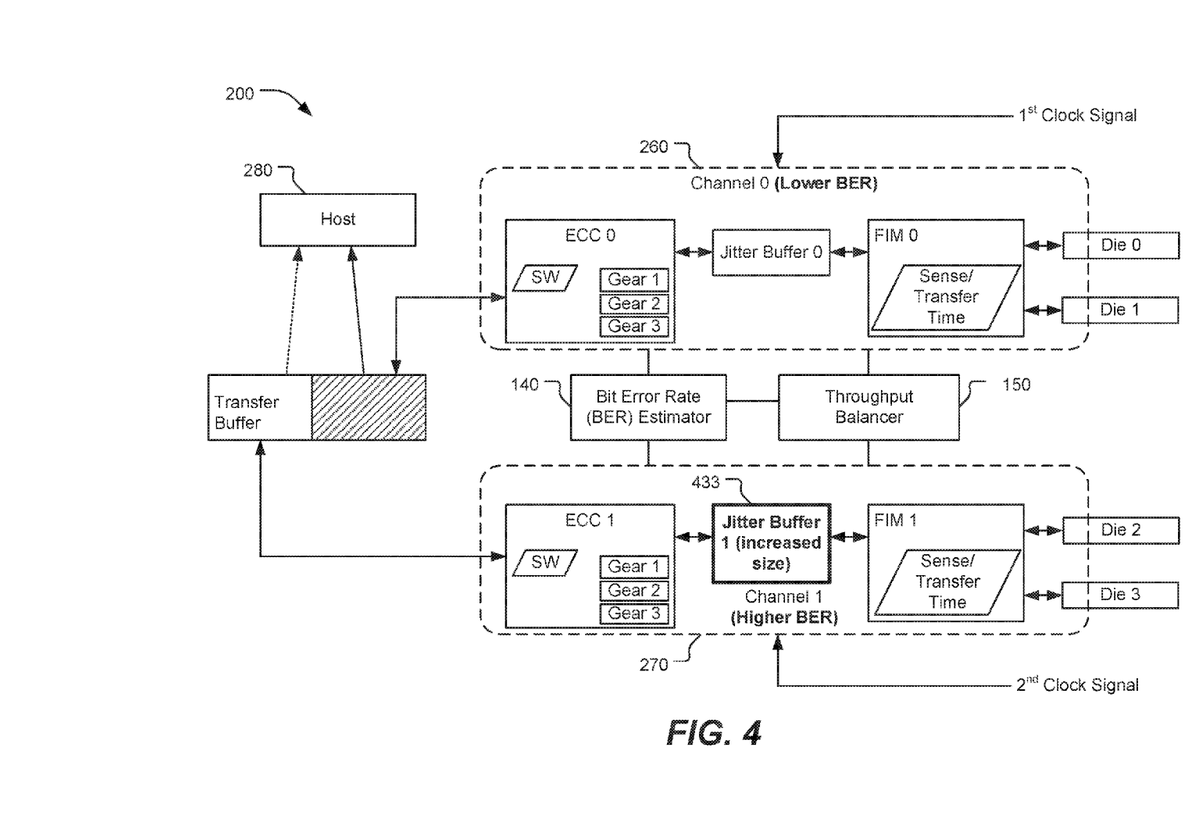
FIG. 4 is a diagram illustrating particular aspects of another example of the system of FIG. 1, including adjusting buffer allocation of a multi-channel memory based on bit error rates.
Figure 5:
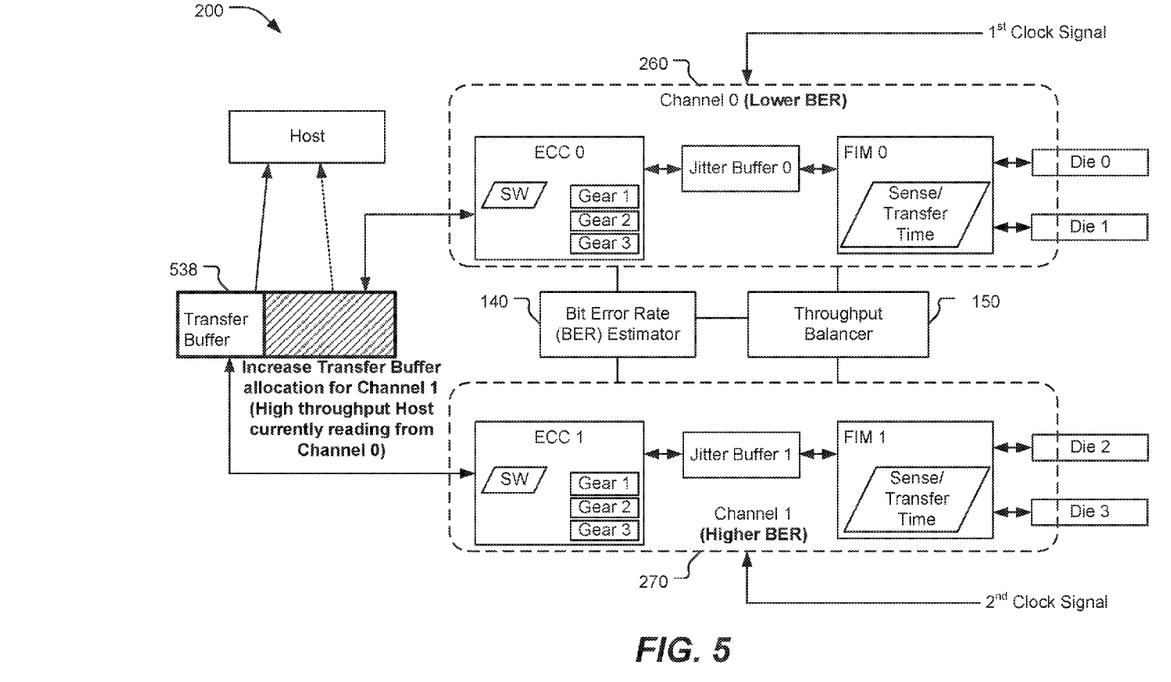
FIG. 5 is a diagram illustrating particular aspects of another example of the system of FIG. 1, including adjusting buffer allocation of a multi-channel memory based on bit error rates.
Figure 6:
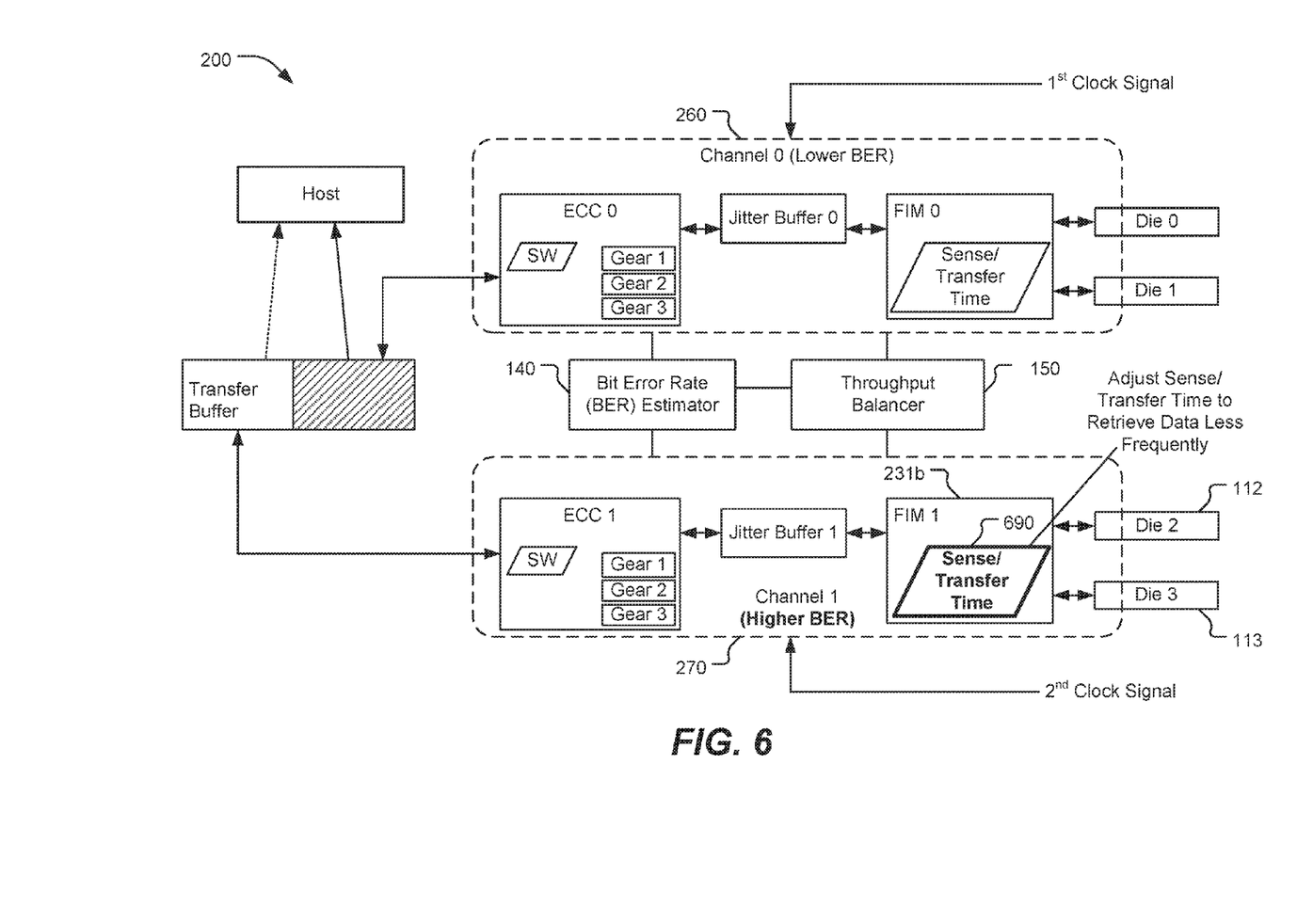
FIG. 6 is a diagram illustrating particular aspects of another example of the system of FIG. 1, including adjusting when sense/transfer commands are executed at a multi-channel memory based on bit error rates.

In the example of FIG. 4, the throughput balancer 150 increases the size of the jitter buffer of the higher BER channel (illustrated as the second channel 270), as shown at 433. Referring to FIG. 5, if the host 280 has higher throughput than the rest of the system 20X), the channel 260, 270 that the host 280 is "currently" reading from may receive a smaller transfer buffer allocation and other channel(s) that the host 280 is not currently reading from (and which may experience hiccups) may receive larger transfer buffer allocations, as shown at 538. In the example of FIG. 6, the throughput balancer 150 adjusts sense/transfer execution time at the higher BER channel (e.g., second channel 270), as shown at 690. To illustrate, if the die 112 has a higher BER than the die 113, then the sense/transfer execution time may be adjusted so that that the FIM 231b retrieves data less frequently from the die 112 than from the die 113.

Although FIGS. 3-6 illustrate examples of different operations that can be performed to balance throughput at a multi-channel memory, it is to be understood that such options are not mutually exclusive. More, fewer, and/or different operations may be performed to balance throughput at a multi-channel memory in alternative examples.

Figure 7:
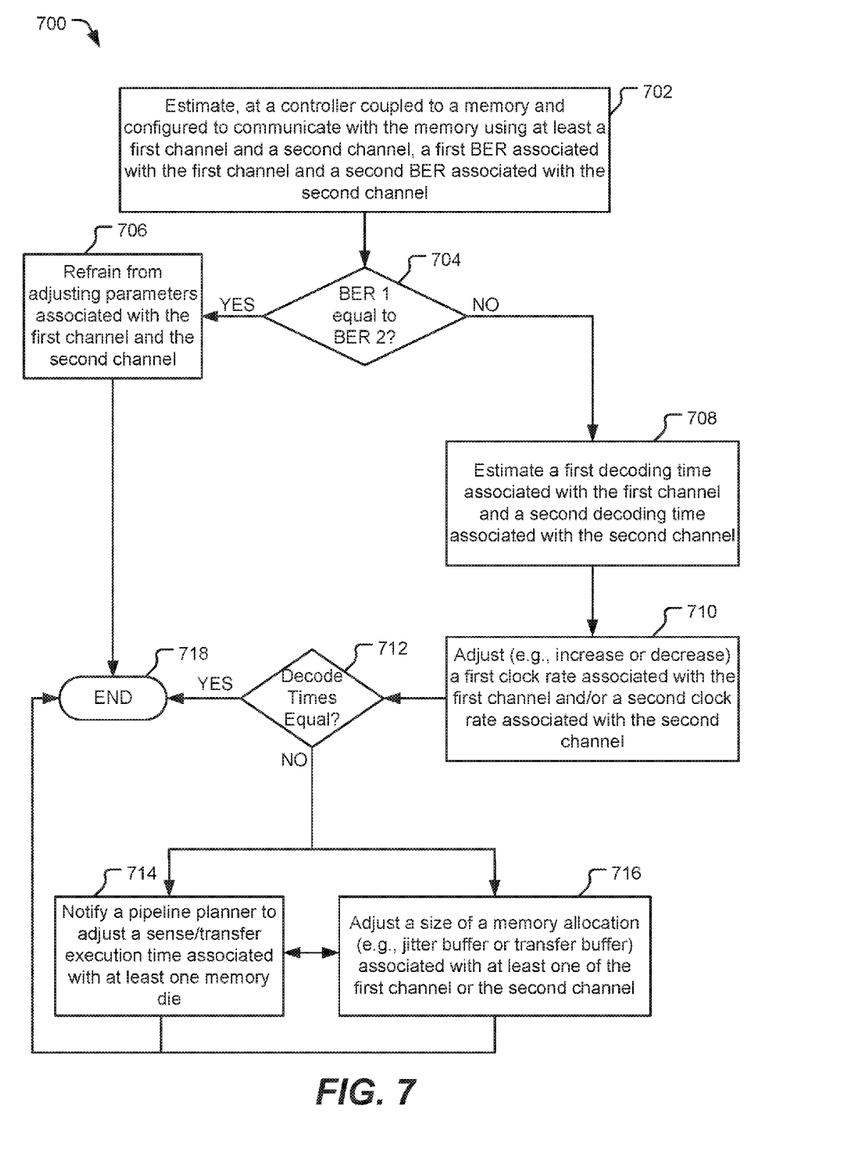
FIG. 7 is a flow chart of an illustrative example of a method of selectively balancing throughput at a multi-channel memory based on bit error rates.

Referring to FIG. 7, a particular illustrative example of a method 700 of selectively balancing throughput at a multi-channel memory based on BERs is shown. The method 700 may be performed at a device, such as at the device 102 of FIG. 1 or within the system 200 of FIGS. 3-6.

A controller estimates a first BER and a second BER, at 702. The controller is coupled to a memory and is configured to communicate with the memory using at least a first channel and a second channel. The first BER is associated with the first channel and the second BER is associated with the second channel. For example, referring to FIG. 1, the BER estimator 140 may estimate the first BER 142 associated with the first channel 160 and the second BER 144 associated with the second channel 170. The first BER 142 and the second BER 144 may be determined based on syndrome weights, based on a mode of decoding operations at the decoders 136, based on one or more mother factors, or any combination thereof.

The first BER is compared to the second BER, at 704. When the first BER and the second BER are equal or near-equal (e.g., differ by less than a threshold amount, such as 5%), the controller refrains from adjusting parameters associated with the first channel and the second channel, at 706, and the method 700 ends, at 718. For example, referring to FIG. 1, the throughput balancer 150 may refrain from adjusting operating parameters associated with the channels 160, 170. Alternatively, when the first BER and the second BER differ by at least a threshold amount, the controller estimates a first decoding time associated with the first channel and a second decoding time associated with the second channel, at 708. For example, referring to FIG. 1, the throughput balancer 150 may estimate decoding times of the decoders 136 in the channels 160, 170.

Continuing to 710, the controller adjusts a first clock rate associated with the first channel and/or a second clock rate associated with the second channel. For example, referring to FIG. 1, if the first channel 160 has a higher BER than the second channel 170, the throughput balancer 150 may increase a clock rate associated with the first channel 160 and/or decrease a clock rate associated with the second channel 170. In an illustrative example, the clock rate(s) may be adjusted as described with reference to FIG. 3.

Adjusting clock rate(s) may result in changes to the estimated decoding times of the channels. At 712, the controller determines whether the changed estimated decoding times are equal or near-equal (e.g., differ by less than a threshold amount, such as 5%). If so, the method 700 ends, at 718. If the changed estimated decoding times are not equal or near-equal, the controller adjusts a size of a resource allocation associated with at least one of the first channel or the second channel, at 714. For example, referring to FIG. 1, the throughput balancer 150 may adjust a size of one or more of the jitter buffers 133, a size of at least a portion of the transfer buffer 138, or any combination thereof. In an illustrative aspect, buffer allocations may be adjusted as described with reference to FIGS. 4 and 5. Alternatively, or in addition, a pipeline planner (e.g., within the controller) may adjust a sense/transfer execution time associated with at least one memory die, at 716. For example, referring to FIG. 1, the throughput balancer may notify the pipeline planner 132 to adjust a sense/transfer execution time associated with at least one of the memory dies 110-113. In an illustrative aspect, a sense/transfer execution time may be adjusted as described with reference to FIG. 6.

After resource allocations and/or sense/transfer execution times are adjusted, the method 700 may end, at 718. However, it is to be understood that the method 700 may be iteratively performed at a device, and different adjustments may be performed at different times depending on how estimated BERs vary at the device.

FIG. 7 thus illustrates a method by which a controller of a device may balance throughput when channels of a multi-channel memory have varying BERs. Although FIG. 7 depicts comparing estimated BERs, in an alternative aspect the operating parameter(s) of one channel may be adjusted independent of operating parameter(s) or an estimated BER of another channel. To illustrate, rather than comparing estimated BERs to each other, a controller may determine whether the estimated BER of a channel is greater than or less than a threshold BER. If the estimated BER is greater than the threshold BER, operating parameter(s) (e.g., clock rate, resource allocations, sense/transfer execution times, etc.) of the channel may be adjusted.

Although various components depicted herein are illustrated as block components and described in general terms, such components may include one or more microprocessors, state machines, or other circuits configured to enable such components to perform one or more operations described herein. For example, components of the controller 130 of FIG. 1 and/or the system 200 of FIG. 2, may represent physical components, such as hardware controllers, state machines, logic circuits, or other structures, to enable various operations described herein.

Alternatively or in addition, at least a portion of one or more components of the controller 130 and/or the system 200 may be implemented using a microprocessor or microcontroller. For example, described operations may be performed by a processor executing instructions (e.g., firmware) that are stored at a memory, such as the memory 104 of FIG. 1. Alternatively, or in addition, executable instructions that are executed by the processor may be stored at a separate memory location that is not part of the memory 104, such as at a read-only memory (ROM) of the controller 130.

It should be appreciated that in alternative implementations, one or more operations described herein as being performed by the controller 130 may be performed at the memory device 103. As an illustrative example, in-memory ECC operations (e.g., encoding operations and/or decoding operations) may be performed at the memory device 103 alternatively or in addition to performing such operations at the controller 130.

In conjunction with the described aspects, an apparatus may include means for storing data. For example, the means for storing data may include the memory device 103, the memory 104, one or more of the memory dies 110-113, one or more other devices, structures, or circuits configured to store data, or any combination thereof.

The apparatus may also include means for estimating a first BER corresponding to a first channel associated with the means for storing data and for estimating a second BER corresponding to a second channel associated with the means for storing data. For example, the means for estimating may include the BER estimator 140 of FIG. 1. To illustrate, the means for estimating may estimate BERs based on syndrome weights and/or decoding modes in use at the first channel and the second channel. In some examples, the means for estimating may operate in accordance with at least a portion of the flowchart of FIG. 7.

The apparatus may further include means for determining whether to adjust at least one of a first clock rate of the first channel or a second clock rate of the second channel based on the first BER and the second BER. For example, the means for determining may include the throughput balancer 150 of FIG. 1. In some examples, the means for determining may operate in accordance with at least a portion of the flowchart of FIG. 7.

The first channel may include first means for buffering data and the second channel may include second means for buffering data. For example, the first means for buffering data may include a first of the jitter buffers 133 of FIG. 1 or the first jitter buffer 233a of FIG. 2, and the second means for buffering data may include a second of the jitter buffers 133 of FIG. 1 or the second jitter buffer 233b of FIG. 2.

In particular aspects, a memory (e.g., a drive of the memory device 103) may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. In a particular embodiment, the device 102 is indirectly coupled to an accessing device (e.g., the access device 180) via a network. For example, the device 102 may be a network-attached storage (NAS) device or a component (e.g., a solid-state drive (SSD) component) of a data center storage system, an enterprise storage system, or a storage area network.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A device comprising:
 a memory that includes a plurality of memory dies; and
 a controller coupled to the memory and configured to communicate with the memory using at least a first channel and a second channel, the controller comprising:
  a bit error rate (BER) estimator configured to estimate a first BER corresponding to first data communicated using the first channel and to estimate a second BER corresponding to second data communicated using the second channel;
  a throughput balancer configured to determine whether to adjust, in response to estimation of the first BER and the second BER, at least one of a first clock rate of the first channel or a second clock rate of the second channel; and
  a pipeline planner configured to adjust a sense-transfer execution time associated with at least one of the plurality of memory dies in response to estimation of the first BER and estimation of the second BER.

2. The device of claim 1, wherein the first channel supports data access operations with respect to a first subset of memory dies of the plurality of memory dies, and wherein the second channel supports data access operations with respect to a second subset of memory dies of the plurality of memory dies.

3. The device of claim 1, wherein the first channel includes a first memory interface and a first decoder, and wherein the second channel includes a second memory interface and a second decoder.

4. The device of claim 3, wherein the first decoder comprises a first low-density parity-check code (LDPC) decoder and wherein the second decoder comprises a second LDPC decoder.

5. The device of claim 3, wherein the first channel further includes a first jitter buffer disposed between the first memory interface and the first decoder, and wherein the second channel further includes a second jitter buffer disposed between the second memory interface and the second decoder.

6. The device of claim 5, wherein the first jitter buffer and the second jitter buffer correspond to portions of a single shared memory buffer.

7. The device of claim 5, wherein the throughput balancer is further configured to determine whether to adjust a size of at least one of the first jitter buffer or the second jitter buffer based on a comparison of the first BER to the second BER.

8. The device of claim 1, wherein the memory comprises a flash memory.

9. The device of claim 1, wherein the first channel and the second channel share a transfer buffer.

10. The device of claim 1, wherein the BER estimator is further configured to estimate the first BER based on a syndrome weight determined during decoding operations at the first channel.

11. The device of claim 1, wherein the BER estimator is further configured to estimate the first BER based on a decoding mode or decoding time associated with decoding operations at the first channel.

12. The device of claim 1, wherein the first channel is associated with a first data throughput, and wherein the second channel is associated with a second data throughput.

13. The device of claim 12, wherein the throughput balancer is further configured to adjust one or more of the first clock rate or the second clock rate to reduce a difference between the first throughput and the second throughput.

14. A method comprising:
   estimating, at a controller that is coupled to a memory and that communicates with the memory using at least a first channel and a second channel, a first bit error rate (BER) associated with first data communicated using the first channel and a second BER associated with second data communicated using the second channel; and
   in response to estimating the first BER and the second BER:
      determining whether to adjust at least one of a first clock rate of the first channel or a second clock rate of the second channel based on the first BER and the second BER; and
      adjusting a sense-transfer execution time associated with at least one memory die of a plurality of memory dies included in the memory.

15. The method of claim 14, further comprising refraining from adjusting the first clock rate and the second clock rate responsive to the first BER and the second BER differing by less than a threshold amount.

16. The method of claim 14, further comprising, responsive to the first BER being at least a threshold amount higher than the second BER:
   increasing a clock rate of the first channel;
   decreasing a clock rate of the second channel; or
   a combination thereof.

17. The method of claim 14, further comprising, after adjusting at least one of the first clock rate or the second clock rate, determining that a first decoding time associated with the first channel differs from a second decoding time associated with the second channel by at least a threshold amount.

18. The method of claim 14, further comprising, after adjusting at least one of the first clock rate or the second clock rate:
   determining that a first decoding time associated with the first channel differs from a second decoding time associated with the second channel by at least a threshold amount; and
   adjusting a size of at least one of a first jitter buffer associated with the first channel or a second jitter buffer associated with the second channel.

19. An apparatus comprising:
   means for storing data, the means for storing data including a plurality of memory dies;
   means for accessing the means for storing data using a first channel and a second channel, for estimating a first bit error rate (BER) corresponding to first data communicated using the first channel, and for estimating a second BER corresponding to second data communicated using the second channel;
   means for adjusting at least one of a first clock rate of the first channel or a second clock rate of the second channel in response to estimation of the first BER and estimation of the second BER; and
   means for adjusting a sense-transfer execution time associated with at least one of the plurality of memory dies in response to estimation of the first BER and further in response to estimation of the second BER.

20. The apparatus of claim 19, wherein the first channel comprises first means for buffering data, wherein the second channel comprises second means for buffering data.

* * * * *